United States Patent
Nishioka

(10) Patent No.: US 8,498,093 B2
(45) Date of Patent: Jul. 30, 2013

(54) ELECTROSTATIC CHUCK AND METHOD FOR PRODUCING THE SAME

(75) Inventor: Masao Nishioka, Tokoname (JP)

(73) Assignee: NGK Insulators, Ltd., Nagoya (JP)

( * ) Notice: Subject to any disclaimer, the term of this patent is extended or adjusted under 35 U.S.C. 154(b) by 383 days.

(21) Appl. No.: 12/877,349

(22) Filed: Sep. 8, 2010

(65) Prior Publication Data

US 2011/0063771 A1 Mar. 17, 2011

(30) Foreign Application Priority Data

Sep. 17, 2009 (JP) ................................. 2009-215997

(51) Int. Cl.
*H01T 23/00* (2006.01)

(52) U.S. Cl.
USPC .......................................................... 361/234

(58) Field of Classification Search
USPC .......................................................... 361/234
See application file for complete search history.

(56) References Cited

U.S. PATENT DOCUMENTS

| | | | |
|---|---|---|---|
| 7,091,146 B2 * | 8/2006 | Okiyama et al. | 501/128 |
| 2006/0012087 A1 | 1/2006 | Matsuda et al. | |

FOREIGN PATENT DOCUMENTS

| | | |
|---|---|---|
| JP | 2001-308167 A1 | 11/2001 |
| JP | 2002-110772 A1 | 4/2002 |
| JP | 2005-343733 A1 | 12/2005 |

* cited by examiner

Primary Examiner — Stephen W Jackson
(74) Attorney, Agent, or Firm — Burr & Brown

(57) ABSTRACT

An electrostatic chuck includes an electrostatic electrode embedded in a ceramic base having a wafer-supporting surface capable of holding a wafer, the electrostatic electrode being parallel to the wafer-supporting surface. The ceramic base is composed of a dense ceramic having a MgO content of 99% by weight or more. The electrostatic electrode is a disc-like electrode composed of, for example, at least one metal selected from the group consisting of Ni, Co, and Fe. The electrostatic electrode includes a conductive tablet connected to the center thereof. The tablet is exposed at the bottom of a counter-bored hole formed so as to reach the tablet from a back surface of the ceramic base, and is connected to a feeding terminal, composed of Ni, inserted into the counter-bored hole.

8 Claims, 4 Drawing Sheets

ELECTROSTATIC CHUCK AND METHOD FOR PRODUCING THE SAME

BACKGROUND OF THE INVENTION

1. Field of the Invention

The present invention relates to an electrostatic chuck and a method for producing the electrostatic chuck.

2. Description of the Related Art

In a process for manufacturing a semiconductor device, a semiconductor wafer is attracted and held on a wafer-supporting surface of an electrostatic chuck. The attracted and held semiconductor wafer is subjected to various treatments such as heating and etching. The electrostatic chuck is a chuck in which an electrostatic electrode configured to generate an electrostatic force on the wafer-supporting surface is embedded in a ceramic base having the wafer-supporting surface. The electrostatic chuck includes a heater electrode embedded therein, as needed, the heater electrode being configured to heat the wafer-supporting surface (also referred to as a "resistance heating element"). The ceramic base is composed of an alumina sintered body or an aluminum nitride sintered body. Alternatively, in consideration of the fact that the electrostatic chuck is used under an environment in which the electrostatic chuck comes in contact with a fluorine-containing gas, an electrostatic chuck composed of a material having high resistance to corrosion by fluorine, for example, an yttria sintered body or a magnesia sintered body, has been reported. For example, Patent Document 1 discloses an electrostatic chuck, composed of a ceramic mainly containing magnesia (MgO), of the Johnsen-Rahbek type.

Prior Art Document

Patent Document 1: JP 2001-308167 A

SUMMARY OF THE INVENTION

However, in the electrostatic chuck including the ceramic base mainly containing MgO, which material is suitable for the electrostatic electrode and the heater electrode is not known so far. The inventors have conducted studies and have found that the use of an inappropriate electrode material disadvantageously causes microcracking in the electrostatic chuck, warpage of the electrostatic chuck, and diffusion of the electrode material into a dielectric layer of the electrostatic chuck, so that the electrostatic chuck does not function as an electrostatic chuck.

The present invention has been accomplished to overcome the foregoing problems. It is a main object of the present invention to provide an electrostatic chuck including an electrode embedded in a MgO ceramic base, in which the occurrence of microcracking and warpage is inhibited and in which the diffusion of an electrode material into a dielectric layer is prevented.

To achieve the foregoing object, an electrostatic chuck of the present invention and a method for producing the electrostatic chuck employ the following means.

The present invention provides an electrostatic chuck including an electrostatic electrode embedded in a MgO ceramic base having a wafer-supporting surface that is parallel to the electrostatic electrode, in which the electrostatic electrode is composed of any one conductive material selected from the group consisting of the following (1) to (6):
(1) a conductive material produced by firing at least one metal selected from the group consisting of Ni, Co, and Fe,
(2) a conductive material produced by firing a mixture of at least one metal powder selected from the group consisting of Ni, Co, and Fe powders and at least one carbide powder selected from the group consisting of TiC, TaC, and NbC powders,
(3) a conductive material produced by firing a mixture of a MgO powder and at least one metal powder selected from the group consisting of Ni, Co, and Fe powders,
(4) a conductive material produced by firing a mixture of a MgO powder, at least one metal powder selected from the group consisting of Ni, Co, and Fe powders, and at least one carbide powder selected from the group consisting of TiC, TaC, and NbC powders,
(5) a conductive material produced by firing a mixture of a MgO powder and a $Cr_3C_2$ powder, or
(6) a conductive material produced by firing a mixture of a MgO powder and at least one carbide powder selected from the group consisting of WC, TiC, TaC, and NbC powders.

The electrostatic chuck may include a heater electrode that is embedded therein so as to be parallel to the wafer-supporting surface, the heater electrode being composed of any one of items (1) to (6). The heater electrode may be composed of the same material as that of the electrostatic electrode.

The present invention also provides a method for producing an electrostatic chuck including an electrostatic electrode embedded in a MgO ceramic base having a wafer-supporting surface that is parallel to the electrostatic electrode, the method comprising the steps of: forming a disc-like thin film composed of an electrode paste for the electrostatic electrode on a surface of a MgO ceramic sintered body; stacking a MgO powder compact on the thin film, thereby forming a laminate; and sintering the laminate by hot pressing. The present invention further provides a method for producing an electrostatic chuck including an electrostatic electrode and a heater electrode that are embedded in a MgO ceramic base having a wafer-supporting surface that is parallel to the electrostatic electrode and the heater electrode, the method comprising the steps of: forming a disc-like thin film composed of an electrode paste for the electrostatic electrode on a surface of a MgO ceramic sintered body; stacking a MgO powder compact on the thin film to form a first intermediate; separately forming a heater electrode pattern composed of an electrode paste for the heater electrode on a surface of a MgO ceramic sintered body to form a second intermediate; stacking the second intermediate on the MgO powder compact of the first intermediate in such a manner that the heater electrode pattern contacts the MgO powder compact, thereby forming a laminate; and sintering the laminate by hot pressing. In these methods of the invention, the electrode paste contains any one material selected from the group consisting of the following (a) to (f):
(a) at least one metal selected from the group consisting of Ni, Co, and Fe,
(b) a mixture of at least one metal powder selected from the group consisting of Ni, Co, and Fe powders and at least one carbide powder selected from the group consisting of TiC, TaC, and NbC powders,
(c) a mixture of a MgO powder and at least one metal powder selected from the group consisting of Ni, Co, and Fe powders,
(d) a mixture of a MgO powder, at least one metal powder selected from the group consisting of Ni, Co, and Fe powders, and at least one carbide powder selected from the group consisting of TiC, TaC, and NbC powders,
(e) a mixture of a MgO powder and a $Cr_3C_2$ powder, or
(f) a mixture of a MgO powder and at least one carbide powder selected from the group consisting of WC, TiC, TaC, and NbC powders. Here, the electrode paste for the electrostatic electrode and the electrode paste for the heater electrode may be composed of the same material or otherwise different materials.

According to the electrostatic chuck of the present invention, for the electrostatic chuck in which the electrode is embedded in the MgO ceramic base, it is possible to inhibit the occurrence of microcracking and warpage and to prevent diffusion of the electrode material into the dielectric layer. The electrostatic chuck may include a heater electrode that is embedded therein so as to be parallel to the wafer-supporting surface, the heater electrode being composed of any one of items (1) to (6). In the case where the electrostatic chuck includes the electrostatic electrode and the heater electrode, if a high-voltage DC power or a high-frequency AC voltage applied to the electrostatic electrode leaks to the heater electrode to generate leakage current, an uneven temperature distribution of the wafer-supporting surface can be caused, thus reducing the uniformity of temperature distribution. In the electrostatic chuck of the present invention, the electrostatic electrode and the heater electrode are composed of any one of items (1) to (6), thus suppressing the generation of leakage current and resulting in a satisfactory uniformity of the temperature distribution of the wafer-supporting surface. In particular, when rapid-response wafer-temperature control is required, the electrostatic chuck needs to have a low heat capacity. That is, the electrostatic chuck needs to have a small thickness. In other words, the distance between the electrostatic electrode and the heater electrode needs to be reduced. This situation is liable to cause the leakage current. However, even in this situation, the generation of the leakage current is inhibited, thus maintaining the uniformity of the temperature distribution of the wafer-supporting surface at a satisfactory level. The reason for the inhibition of the occurrence of the leakage current may be not simply the fact that the thermal expansion coefficient of the electrostatic electrode is close to that of MgO, but that the material contained in the electrostatic electrode is not diffused into MgO (reactivity between the electrostatic electrode and MgO). Furthermore, preferably, the MgO ceramic base does not contain a heavy-metal element (however, several parts per million or less of incidental heavy metals may be contained). The presence of a heavy-metal element prolongs the time (detachment response time) from when the applied voltage is set to zero with the wafer attracted on the wafer-supporting surface to when the wafer is detached, thus reducing the number of wafers treated per hour (throughput). Meanwhile, the method for producing an electrostatic chuck according to the present invention is suited to produce the foregoing electrostatic chuck.

DETAILED DESCRIPTION OF THE INVENTION

First Embodiment

Figure 1:
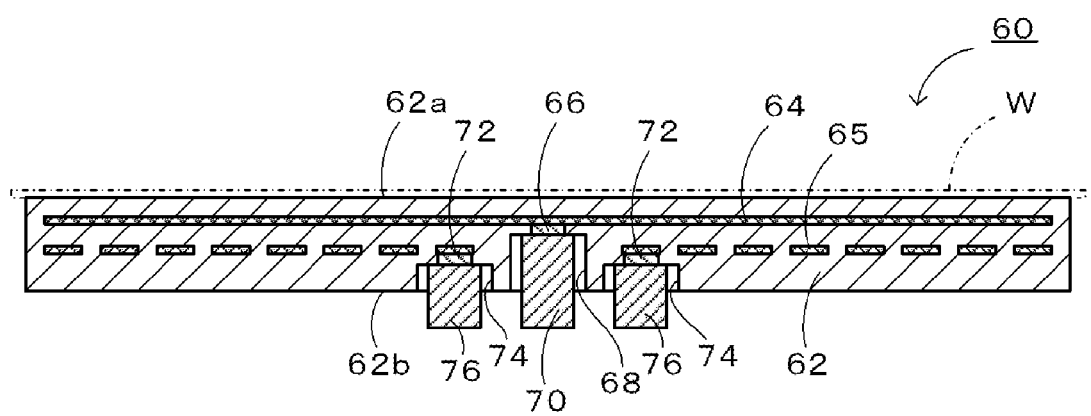
FIG. 1 is a cross-sectional view taken parallel to the central axis of an electrostatic chuck 60 according to a first embodiment.
Figure 2A:
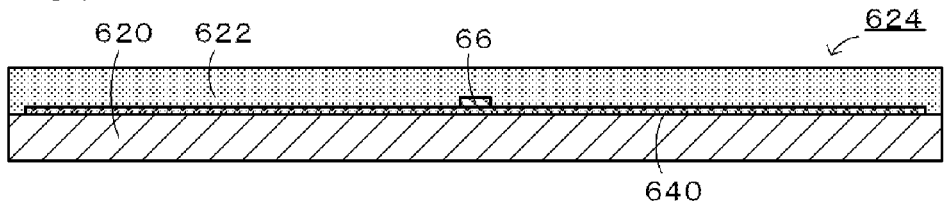
FIG. 2 is a process drawing illustrating a method for producing the electrostatic chuck 60 according to the first embodiment.
Figure 2B:
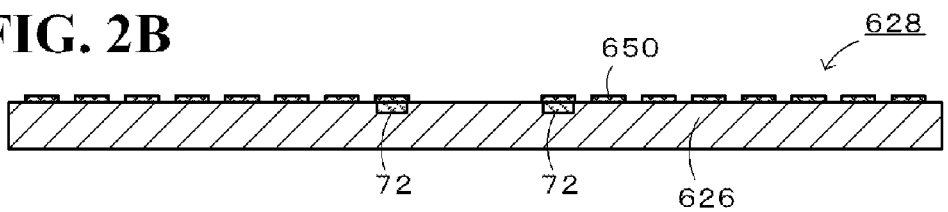
Figure 2C:
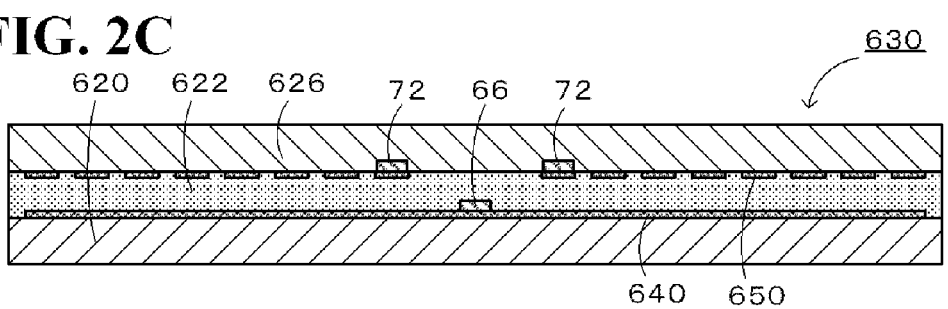
Figure 2D:
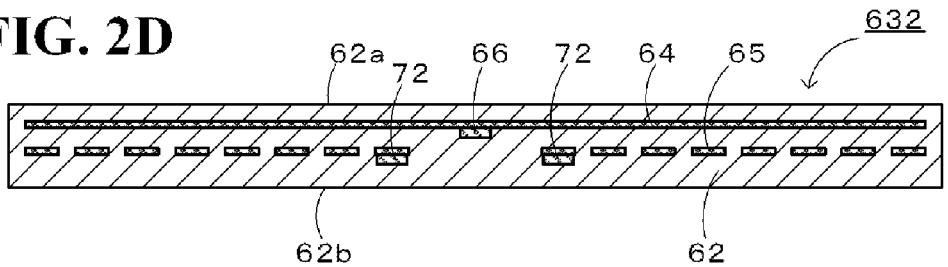
Figure 2E:
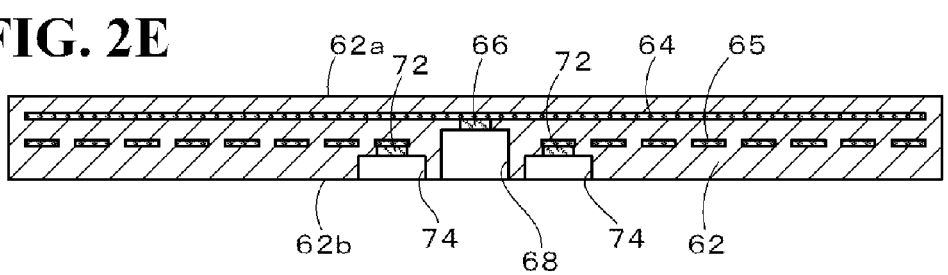
Figure 2F:
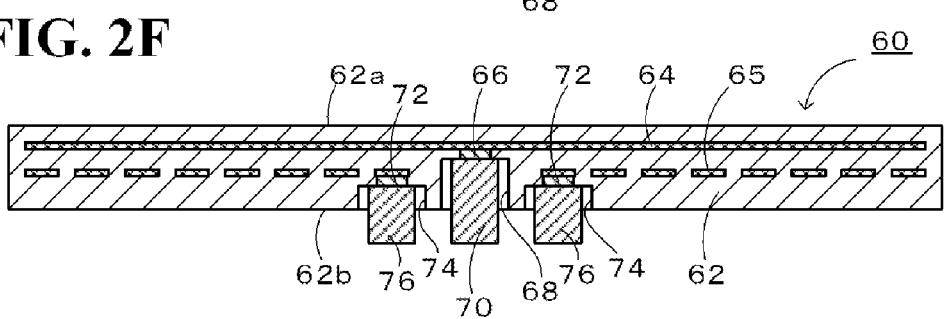

An electrostatic chuck 60 according to a first embodiment will be described below. FIG. 1 is a cross-sectional view taken parallel to the central axis of the electrostatic chuck 60 according to the first embodiment. 2A to 2F are process drawings illustrating a method for producing the electrostatic chuck 60.

The electrostatic chuck 60 according to this embodiment is a chuck in which an electrostatic electrode 64 and a heater electrode 65 are embedded in a ceramic base 62 having a wafer-supporting surface 62a capable of holding a wafer W and are in parallel with the wafer-supporting surface 62a.

The ceramic base 62 is a disc-like member composed of a heavy-metal-free dense MgO ceramic having a MgO content of 99% by weight or more. Here, impurities of light metals (e.g., Al, Si, and Ca), P, and N may be contained in the MgO ceramic. Furthermore, the ceramic base 62 may contain several parts per million or less incidental heavy metals and so forth. The reason for this is that they do not reduce the volume resistivity of a dielectric layer and thus do not serve as sources of contamination.

The electrostatic electrode 64 is a thin film electrode having a smaller diameter than the ceramic base 62. The electrostatic electrode 64 is connected to a conductive tablet 66 at the center thereof. The tablet 66 is exposed at the bottom of a counter-bored hole 68 that is formed from a back surface 62b of the ceramic base 62 so as to reach the tablet 66. A portion between the upper surface of the electrostatic electrode 64 and the wafer-supporting surface 62a of the ceramic base 62 functions as a dielectric layer of the electrostatic chuck 60. A feeding terminal 70 composed of Ni is inserted and fixed in the counter-bored hole 68.

The heater electrode 65 is superposed with the entire surface of the ceramic base 62 to form a pattern similar to a unicursal line and has one end located near the center of the ceramic base 62 and the other end located near the center of the ceramic base 62. Each of the one end and the other end of the heater electrode 65 is connected to a corresponding one of conductive tablets 72. The tablets 72 are exposed at bottoms of counter-bored holes 74 that are formed from the back surface 62b of the ceramic base 62 so as to reach the tablets 72. Feeding terminals 76 composed of Ni are inserted and fixed in the counter-bored holes 74.

Each of the electrostatic electrode 64 and the heater electrode 65 is composed of a material selected from items (1) to (6) shown in Table 1. Note that the preferred mixing ratios shown in Table 1 may be employed when the effects of the present invention are to be fully provided. Even if the mixing ratios are outside the ranges, some of the effects of the present invention are still provided. Furthermore, the electrostatic electrode 64 and the heater electrode 65 may be composed of the same or different materials.

TABLE 1

| Electrostatic Electrode | Material | Preferred Mixing Ratio |
|---|---|---|
| (1) | A conductive material produced by firing at least one metal (Material (a)) selected from the group consisting of Ni, Co, and Fe | |

TABLE 1-continued

| Electrostatic Electrode | Material | Preferred Mixing Ratio |
|---|---|---|
| (2) | A conductive material produced by firing a mixture (Material (b)) of at least one metal powder selected from the group consisting of Ni, Co, and Fe powders and at least one carbide powder selected from the group consisting of TiC, TaC, and NbC powders | Metal powder:carbide powder = 82 to 34:18 to 66 by vol % (totaling 100%) |
| (3) | A conductive material produced by firing a mixture (Material (c)) of a MgO powder and at least one metal powder selected from the group consisting of Ni, Co, and Fe powders | When metal powder is Ni Ni:MgO = 34 to 100:66 to 0 by vol % (totaling 100%), When metal powder is Fe or Co Fe(or Co):MgO = 34 to 82:66 to 18 by vol % (totaling 100%) |
| (4) | A conductive material produced by firing a mixture (Material (d)) of a MgO powder, at least one metal powder selected from the group consisting of Ni, Co, and Fe powders, and at least one carbide powder selected from the group consisting of TiC, TaC, and NbC powders | Metal powder:carbide powder:MgO = 10 to 33:33 to 70:20 to 34 by vol % (totaling 100%) |
| (5) | A conductive material produced by firing a mixture (Material (e)) of a MgO powder and a $Cr_3C_2$ powder | $Cr_3C_2$ powder:MgO powder = 50 to 80:20 to 50 by vol % (totaling 100%) |
| (6) | A conductive material produced by firing a mixture (Material (f)) of a MgO powder and at least one carbide powder selected from the group consisting of WC, TiC, TaC, and NbC powders | Carbide powder:MgO = 34 to 80:20 to 66 by vol % (totaling 100%) |

A method for producing the electrostatic chuck 60 according to this embodiment will be described below with reference to FIG. 2. As with a laminate 124 according to a second embodiment described below, a MgO compact 622 (molded article composed of a MgO powder), a thin film 640 to which the tablet 66 is bonded, the thin film 640 being composed of an electrode paste, and a MgO sintered body 620 are integrated by uniaxial pressing to form a first intermediate 624 (see FIG. 2A). A MgO sintered body 626 is formed in the same way as a MgO sintered body 120 according to the second embodiment described below, separately from the first intermediate 624. Small holes are formed in portions of the MgO sintered body 626 corresponding to one end and the other end of the heater electrode 65 in advance. The tablets 72 to which an adhesive is applied are fitted into the small holes. A pattern 650 for the heater electrode 65 is formed thereon by screen printing or a doctor blade method using an electrode paste containing a raw material the same as that of the electrostatic electrode 64 to form a second intermediate 626 (see FIG. 2B).

Next, the second intermediate 628 is arranged on the MgO compact 622 of the first intermediate 624 in such a manner that the pattern 650 contacts the MgO compact 622. The resulting article is integrated by uniaxial pressing to form laminate 630 (see FIG. 2C). The laminate 630 is hot-pressed into a sintered body 632 including electrodes (see FIG. 2D). Thereby, the MgO sintered body 620, the MgO compact 622, and the MgO sintered body 626 are formed into a single sintered body (ceramic base 62). The thin film 640 is formed into the electrostatic electrode 64. The pattern 650 is formed into the heater electrode 65. Conditions of hot pressing are not particularly limited. For example, hot pressing may be performed in an inert gas atmosphere, e.g., nitrogen, at a uniaxial pressure of 10 to 30 MPa and a firing temperature of 1350° C. to 1800° C. for a firing time of 2 to 8 hours. In this case, the sintered density is preferably 99.5° or more. The resulting sintered body 632 including the electrodes is preferably subjected to grinding in such a manner that the wafer-supporting surface 62a comes to have a surface roughness Ra of 0.01 to 3 μm and a flatness of 0 to 10 μm and that the distance between the upper surface of the electrostatic electrode 64 and the wafer-supporting surface 62a is set to 0.2 to 1 mm. Furthermore, the distance between a surface of the electrostatic electrode 64 and a surface of the heater electrode 65, the surfaces facing each other, is preferably set to 0.8 to 3 mm. The term "flatness" indicates a value determined as follows: An imaginary reference plane is set by the least-square method using all measured coordinates on the ground surface, and the flatness is calculated on the basis of the maximum value and the minimum value of displacement between the measured coordinates and the imaginary reference plane. For example, when the maximum value and the minimum value are +a and −b, respectively, the flatness is determined by a−(−b)=a+b.

The counter-bored hole 68 is formed in the center of the back surface 62b of the sintered body 632 including the electrodes to expose the tablet 66. The counter-bored holes 74 are formed at positions corresponding to the tablets 72 to expose the tablets 72 (see FIG. 2E). When the tablets 66 and 72 are not used, the electrostatic electrode 64 and the heater electrode 65 are exposed. When a lift-pin insertion hole, through which a lift pin is inserted, or a gas feed hole is formed in the electrostatic electrode 64, a through-hole is formed so as to communicate therewith. In this case, the heater electrode 65 is formed in a shape that does not interfere with the through-hole. The feeding terminals 70 and 76 composed of a metal (e.g., Ni) are inserted into the counter-bored holes 68 and 74 and bonded to the exposed surfaces of the tablets 72, thereby completing the electrostatic chuck 60 (see FIG. 2F).

An example of how the electrostatic chuck 60 according to this embodiment is used will be briefly described below. The wafer W is placed on the wafer-supporting surface 62a of the electrostatic chuck 60. A high DC voltage is applied to the electrostatic electrode 64 through the feeding terminal 70 of the electrostatic electrode 64 to generate an electrostatic force, whereby the wafer W is attracted to the wafer-supporting surface 62a. The two feeding terminals 76 and 76 of the heater electrode 65 are connected to a heater power supply. The wafer W is adjusted to have a desired temperature by controlling the supplied electric power. In this situation, the wafer W is subjected to plasma-enhanced CVD to form a film or is subjected to plasma etching. Specifically, a high-frequency voltage is applied to the electrostatic electrode 64 through the feeding terminal 70 in a vacuum chamber (not illustrated) to generate plasma between parallel plate electrodes formed of the electrostatic electrode 64 embedded in the electrostatic chuck 60 and a horizontal counter electrode (not illustrated) arranged at an upper portion in the vacuum chamber. The wafer W is subjected to plasma-enhanced CVD to form a film on the wafer W or is subjected to plasma etching using the plasma.

According to the electrostatic chuck 60 of this embodiment described in detail above, it is possible to suppress the occurrence of microcracking and warpage of an electrostatic chuck in which an electrode is embedded in a MgO ceramic base, and to prevent diffusion of the electrode material into the dielectric layer. Furthermore, the amount of metal contamination of the wafer W placed on the wafer-supporting surface 62a can be suppressed to a very low level. Furthermore, a detachment response time is reduced compared with the related art, thus resulting in satisfactory throughput. If a high-voltage DC power or a high-frequency AC voltage applied to the electrostatic electrode 64 leaks to the heater electrode 65 to generate leakage current, an uneven temperature distribution of the wafer-supporting surface 62a can be caused, thus reducing the uniformity of temperature distribution. For the electrostatic chuck 60 according to this embodiment, the electrode material is one selected from the foregoing items (1) to (6), which are not easily diffused into the ceramic and have high adhesiveness, thus suppressing the generation of leakage current. This results in uniform heat conduction and uniform temperature distribution of the wafer-supporting surface 62a. In particular, when rapid-response wafer-temperature control is required, the electrostatic chuck 60 needs to have a low heat capacity. That is, the electrostatic chuck 60 needs to have a small thickness. In other words, the distance between the electrostatic electrode 64 and the heater electrode 65 needs to be reduced. This situation is liable to cause the leakage current. However, even in this situation, the generation of the leakage current is inhibited, thus maintaining the uniformity of the temperature distribution of the wafer-supporting surface 62a at a satisfactory level.

Second Embodiment

Figure 3:
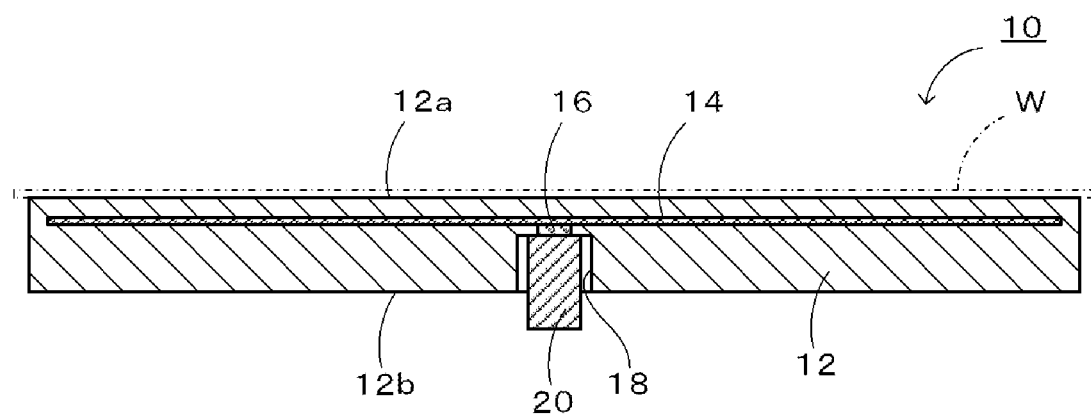
FIG. 3 is a cross-sectional view taken parallel to the central axis of an electrostatic chuck 10 according to a second embodiment.

A electrostatic chuck 10 according to a second embodiment will be described below. FIG. 3 is a cross-sectional view taken parallel to the central ails of the electrostatic chuck 10 according to the second embodiment. FIGS. 4A to 4F are process drawings illustrating a method for producing the electrostatic chuck 10. The electrostatic chuck 10 according to the second embodiment is a chuck in which an electrostatic electrode 14 is embedded in a ceramic base 12 having a wafer-supporting surface 12a capable of holding a wafer W and is in parallel with the wafer-supporting surface 12a.

The ceramic base 12 is a disc-like member composed of a heavy-metal-free dense MgO ceramic having a MgO content of 99% by weight or more. Here, light metals (e.g., Al, Si, and Ca) and impurities of P and N may be contained in the MgO ceramic. Furthermore, the ceramic base 12 may contain several parts per million or less incidental heavy metals and so forth. The reason for this is that these do not reduce the volume resistivity of a dielectric layer and thus do not serve as sources of contamination.

The electrostatic electrode 14 is a thin film electrode having a smaller diameter than the ceramic base 12. Alternatively, the electrostatic electrode 14 may be a flat plate or a sheet-like mesh formed by knitting thin metal wires into a net. The electrostatic electrode 14 is connected to a conductive tablet 16 at the center thereof. The tablet 16 is exposed at the bottom of a counter-bored hole 18 that is formed from a surface (back surface) 12b of the ceramic base 12 opposite the wafer-supporting surface 12a so as to reach the tablet 16. A portion between the upper surface of the electrostatic electrode 14 and the wafer-supporting surface 12a of the ceramic base 12 functions as a dielectric layer of the electrostatic chuck 10. A feeding terminal 20 composed of Ni is inserted and fixed in the counter-bored hole 18.

The electrostatic electrode 14 is composed of a material selected from items (1) to (6) shown in Table 1. Note that the preferred mixing ratios shown in Table 1 may be employed when the effects of the present invention are to be fully provided. Even if the mixing ratios are outside the ranges, some of the effects of the present invention are still provided.

A method for producing the electrostatic chuck 10 will be described below with reference to FIGS. 4A to 4G. A MgO powder is formed into a compact and then fired to form a MgO sintered body 120 (see FIG. 4A). For example, the MgO powder having a purity of 99, or more and an average particle size of 0.5 to 3 μm is directly subjected to uniaxial pressing to form a MgO compact. Alternatively, the MgO powder is granulated to form a granulated powder. The granulated powder is subjected to uniaxial pressing to form a MgO compact. The MgO compact is hot-pressed to form the MgO sintered body 120. Conditions of hot pressing are not particularly limited. For example, hot pressing may be performed in an inert gas atmosphere, e.g., nitrogen, at a uniaxial pressure of 10 to 30 MPa and a firing temperature of 1350° C. to 1800° C. for a firing time of 2 to 8 hours. In this case, the sintered density is preferably 99.5% or more. For example, the resulting MgO sintered body 120 is preferably subjected to grinding to have a disc-like shape with a surface roughness Ra of 0.01 to 3 μm and a flatness of 0 to 10 μm.

Figure 4A:
FIG. 4 is a process drawing illustrating a method for producing the electrostatic chuck 10 according to the second embodiment.
Figure 4B:
Figure 4C:
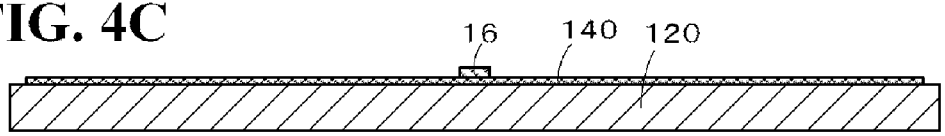
Figure 4D:
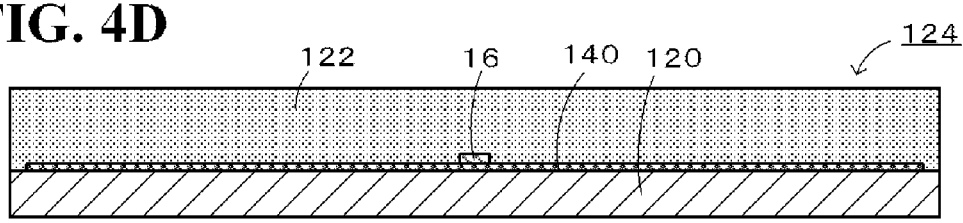

Next, a thin film 140 composed of an electrode paste containing a raw material for the electrostatic electrode 14 is formed on the MgO sintered body 120 (see FIG. 4B). Specifically, one of the raw materials (a) to (f) for the materials (1) to (6) shown in Table 1 is dispersed in a solvent to form an electrode paste. The electrode paste is applied to a surface of the MgO sintered body 120 by a thin-film forming method, for example, screen printing or a doctor blade method, to form the disc-like thin film 140 composed of the electrode paste. A hole may be appropriately formed in a necessary portion of the thin film 140. Examples of the hole include a lift-pin insertion hole, through which a lift pin configured to lift the wafer W placed on the wafer-supporting surface 12a of the electrostatic chuck 10 is inserted; and a gas feed hole configured to feed a cooling gas, such as He gas, to the back surface of the wafer W placed on the wafer-supporting surface 12a. The tablet 16, which is a disc-like member, composed of a raw material the same as that of the electrostatic electrode 14 is bonded to the center of the thin film 140 composed of the electrode paste (see FIG. 4C). The bonded tablet 16 prevents damage to the electrostatic electrode 14 by a counterboring tool when in the subsequent step, the counter-bored hole 18 is formed from the back surface 12b of the ceramic base 12 toward the electrostatic electrode 14. That is, in the case where the counter-bored hole 18 is formed so as to expose the tablet 16 at the bottom of the counter-bored hole 18, the tablet 16 can be ground, but the electrostatic electrode 14, which is a thin layer, is not ground.

A MgO powder is placed on the thin film 140 composed of the electrode paste on the MgO sintered body 120. Uniaxial pressing is performed with a die, forming the laminate 124 in which a MgO compact (molded article composed of the MgO powder) 122, the thin film 140 composed of the electrode paste, and the MgO sintered body 120 are integrated (see FIG. 4D). As the MgO powder used for the MgO compact 122, a MgO powder having a purity of 99% or more and an average particle size of 0.5 to 3 μm may be used as it is. Alternatively, the MgO powder is granulated to form a granulated powder. The resulting granulated powder may be used.

Figure 4E:
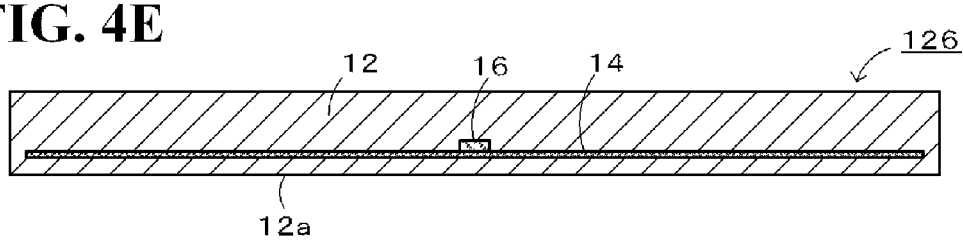

The laminate 124 is hot-pressed to form a sintered body 126 including the electrode (see FIG. 4(e)). Thereby, the MgO sintered body 120 and the MgO compact 122 are formed into a single sintered body (ceramic base 12). The thin film 140 is formed into the electrostatic electrode 14. Conditions of hot pressing are not particularly limited. For example, hot pressing may be performed in an inert gas atmosphere, e.g., nitrogen, at a uniaxial pressure of 10 to 30 MPa and a firing temperature of 1350° C. to 1800° C. for a firing time of 2 to 8 hours. In this case, the sintered density is preferably 99.5% or more. The resulting sintered body 126 including the electrode is preferably subjected to grinding in such a manner that the wafer-supporting surface 12a has a surface roughness Ra of 0.01 to 3 μm and a flatness of 0 to 10 μm and that the distance between the upper surface of the electrostatic electrode 14 and the wafer-supporting surface 12a is set to 0.2 to 1 mm.

Figure 4F:
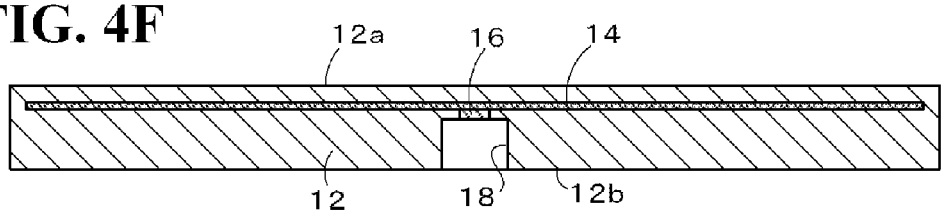
Figure 4G:
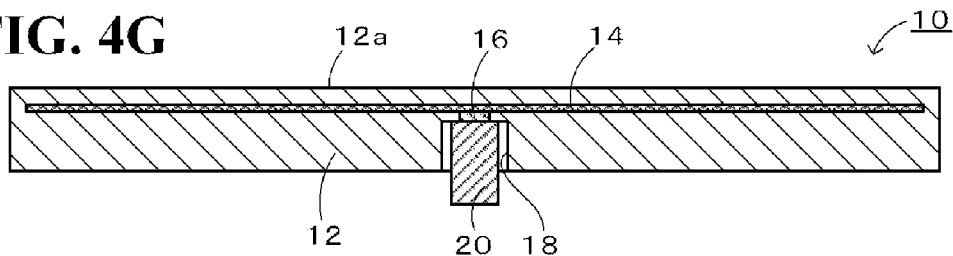

The counter-bored hole 18 is formed at the center of the back surface 12b of the sintered body 126 including the electrode to expose the tablet 16 (see FIG. 4F). If the tablet 16 is not used, the electrostatic electrode 14 is exposed. When a lift-pin insertion hole or a gas feed hole is formed in the electrostatic electrode 14, a through-hole communicating therewith is formed. The feeding terminal 20 composed of a metal (e.g., Ni) is inserted into the counter-bored hole 18 and bonded to the exposed surface of the tablet 16 (the exposed surface of the electrostatic electrode 14 when the tablet 16 is not used), thereby completing the electrostatic chuck 10 (see FIG. 4G).

An example of how the electrostatic chuck 10 according to this embodiment is used will be briefly described below. The wafer 11 is placed on the wafer-supporting surface 12a of the electrostatic chuck 10. A high DC voltage is applied to the electrostatic electrode 14 through the feeding terminal 20 to generate an electrostatic force, whereby the wafer W is drawn on the wafer-supporting surface 62a. In this situation, the wafer W is subjected to plasma-enhanced CVD to form a film on the wafer W or plasma etching. Specifically, a high-frequency voltage is applied to the electrostatic electrode 14 through the feeding terminal 20 in a vacuum chamber (not illustrated) to generate plasma between parallel plate electrodes formed of the electrostatic electrode 14 embedded in the electrostatic chuck 10 and a horizontal counter electrode (not illustrated) arranged at an upper portion in the vacuum chamber. The wafer W is subjected to plasma-enhanced CVD to form a film or plasma etching using the plasma.

According to the electrostatic chuck 10 of this embodiment described in detail above, it is possible to suppress the occurrence of microcracking and warpage of an electrostatic chuck in which an electrode is embedded in a MgO ceramic base, and to prevent diffusion of the electrode material into the dielectric layer. Furthermore, the amount of metal contamination of the wafer W placed on the wafer-supporting surface 12a can be suppressed to a very low level. Furthermore, a detachment response time is reduced compared with the related art, thus resulting in satisfactory throughput.

The present invention is not limited to the foregoing embodiments. It will be obvious that various modifications may be made so long as these modifications are included in the technical scope of the invention.

EXAMPLES

Examples 1 to 45

Specific examples of the electrostatic chuck 60 according to the first embodiment are described in Examples 1 to 45.

First, 0.5 parts by weight of poly(vinyl alcohol) and 100 parts by weight of water were mixed with 50 parts by weight of a MgO powder (with an average particle size of 1.2 μm) having a purity of 99.5% to form a slurry. The slurry was subjected to spray drying to form a granulated MgO powder (with an average particle size of 30 to 40 μm). The granulated MgO powder was charged into a die and was then leveled off. Uniaxial pressing was performed at a pressure of 10 MPa to form a disc-like compact having a diameter of 320 mm and a thickness of 7 mm. The compact was transferred into a graphite die. The graphite die was placed in a hot-press furnace and fired at 1800° C. for 2 hours at a pressure of 1.01 atm in nitrogen and a uniaxial pressure of 20 MPa, forming a MgO sintered body. The MgO sintered body was ground with diamond to form a disc having a thickness of 3 mm and a diameter of 350 mm. The disc had a surface roughness Ra of 2 μm and a sintered density of 99.5 or more. A main surface with a diameter of 350 mm had a flatness of 10 μm or less.

An electrode material shown in Table 2 was mired with terpineol to form a paste. The paste was applied to a surface of the disc-shaped MgO sintered body by screen printing to form an electrostatic electrode. The electrostatic electrode was circular and had an eternal diameter of 297 mm and holes in necessary portions. The holes were located at the portions through which a lift pin will be inserted and a through-hole configured to feed a gas will be formed. After printing, drying was performed at 60° C. in air to fix the electrostatic electrode. A disc (hereinafter, referred to as a "tablet"), having a diameter of 2 mm and a thickness of 1 mm, composed of an electrode material shown in Table 3 was bonded at the center of the electrostatic electrode using an adhesive. The tablet was produced by miring 10 cc of a tapped raw material powder with 0.5 cc of an aqueous solution containing by weight in a mortar, transferring the resulting paste into a die, and performing uniaxial pressing at 5 MPa. The tablet may not be a molded article composed of a powder. Separately, a molded article may be fired in an inert atmosphere (in nitrogen or argon) to increase the density in advance. In this case, the fired tablet need not be fully densified. The tablet may have a porosity of several percent to several tens of percent. A fired article can be easily handled, rather than a molded article.

The MgO sintered body on which the electrostatic electrode had been fixed was placed in a die with the electrostatic electrode surface up. A granulated MgO powder was charged into the die so as to be deposited on the electrostatic electrode. Uniaxial pressing was performed at 10 MPa. A molded portion had a thickness of 3 mm. A first intermediate including the sintered body and the molded portion was placed in a graphite die with the molded portion side up. Separately, another MgO sintered body was produced in the same way as the foregoing MgO sintered body. The same paste as that used for the electrostatic electrode was applied by printing on a main surface of this MgO sintered body to form a heater electrode. Here, before the heater electrode was formed by printing, small holes for tablets to be fitted were formed in portions of the MgO sintered body to which feeding terminals for the heater electrode will be attached. The tablets were fitted thereinto with an adhesive. Drying was performed at 60° C. in air to fix the heater electrode. Thereby, a second intermediate was produced.

The second intermediate was stacked on the first intermediate, which had been placed in the graphite die, in such a manner that the surface on which the heater electrode was formed by printing contacted the molded portion of the first intermediate, thereby forming a laminate. The graphite die containing the laminate was placed in a hot-press furnace and fired at a pressure of 1.01 atm in nitrogen, a uniaxial pressure of 24 MPa, and a firing temperature for a firing time shown in Table 3, thereby forming a MgO sintered body in which both the electrostatic electrode and the heater electrode were embedded. The MgO sintered body was ground to have a disc shape having a diameter of 299 mm and a thickness of 4 mm. In this case, the distance between a surface of the embedded electrostatic electrode and a surface (wafer-supporting surface) configured to attract and hold a wafer was 0.4 mm. Furthermore, the distance between the electrostatic electrode and the heater electrode was 1.9 mm.

Next, a counter-bored hole having a diameter of 5 mm was formed at the center of a surface opposite the attracting surface to expose the tablet connected to the electrostatic electrode at the bottom of the counter-bored hole. Furthermore, counter-bored holes having a diameter of 5 mm were also formed in portions corresponding to the tablets connected to the heater electrode to expose the tablets at the bottom. In addition, through-holes were formed in predetermined portions to form a gas feed hole and a hole through which a lift pin configured to lift a wafer will be inserted. Then feeding terminals, composed of Ni, having a diameter of 4.9 mm were inserted into the counter-bored holes and bonded to the exposed surfaces of the tablets and the inner circumferences, which were composed of the MgO ceramic, of the counter-bored holes using an indium brazing alloy. Indium brazing was performed at 200° C. for 5 minutes in a vacuum furnace at an atmospheric pressure of 100 Pa or less. As described above, electrostatic chucks of Examples 1 to 45 were produced. Each of the electrostatic chucks was a chuck in which the electrostatic electrode and the heater electrode were embedded in the ceramic base having the wafer-supporting surface. Note that Examples 1 to 26, 28, 30, 31, 33, 35, 36, 38, 40, 41, 43, and 45 are described in the specification of a previous application (Japanese Patent Application No. 2009-215997).

Raw materials used for electrode materials shown in Table 2 are as follows:

Ni powder, purity: 99.9%, average particle size: 1 μm;

Co powder, purity: 99.9%, average particle size: 1 μm;

Fe powder, purity: 99.99%, particle size: 44 μm (325 mesh) or less;

TiC powder, purity: 99%, average particle size: 1.5 μm.

TaC powder, purity: 99%, average particle size: 5 μm;

NbC powder, purity: 97%, average particle size: 5 μm;

$Cr_3C_2$ powder, purity: 97%, average particle size: 5 μm;

WC powder, purity: 99%, average particle size: 1 μm; and

W powder, purity: 99.9%, average particle size: 1 μm.

TABLE 2

| | Electrode material | Firing temperature (° C.) | Firing time (h) | Displacement of flatness (μm) | Attractive force (Pa) | Detachment response time (sec) | Heater resistance (Ω) | Uniformity of temperature distribution (° C.) |
|---|---|---|---|---|---|---|---|---|
| Example 1 | Ni | 1400 | 6 | 5 | 1200 | 1.5 | 20 | 2.3 |
| Example 2 | Co | 1450 | 6 | 6 | 1240 | 1.5 | 19 | 2.1 |
| Example 3 | Fe | 1500 | 6 | 6 | 1320 | 1.5 | 26 | 2.0 |
| Example 4 | Ni 34vol %, TiC 66vol % | 1400 | 6 | 8 | 1220 | 1.5 | 26 | 0.8 |
| Example 5 | Ni 34vol %, TaC 66vol % | 1400 | 6 | 9 | 1230 | 1.5 | 15 | 0.6 |
| Example 6 | Ni 34vol %, NbC 66vol % | 1400 | 6 | 8 | 1220 | 1.5 | 24 | 0.7 |
| Example 7 | Co 34vol %, TiC 66vol % | 1450 | 6 | 8 | 1280 | 1.5 | 27 | 0.8 |
| Example 8 | Co 34vol %, TaC 66vol % | 1450 | 6 | 9 | 1280 | 1.5 | 17 | 0.8 |
| Example 9 | Co 34vol %, NbC 66vol % | 1450 | 6 | 8 | 1300 | 1.5 | 28 | 0.7 |
| Example 10 | Fe 34vol %, TiC 66vol % | 1500 | 6 | 8 | 1360 | 1.5 | 29 | 0.9 |
| Example 11 | Fe 34vol %, TaC 66vol % | 1500 | 6 | 8 | 1360 | 1.5 | 19 | 0.8 |
| Example 12 | Fe 34vol %, NbC 66vol % | 1500 | 6 | 9 | 1340 | 1.5 | 32 | 0.8 |
| Example 13 | Ni 82vol %, TiC 18vol % | 1400 | 6 | 5 | 1200 | 1.5 | 16 | 1.2 |
| Example 14 | Ni 82vol %, TaC 18vol % | 1400 | 6 | 6 | 1180 | 1.5 | 13 | 1.5 |
| Example 15 | Ni 82vol %, NbC 18vol % | 1400 | 6 | 6 | 1200 | 1.5 | 21 | 1.3 |
| Example 16 | Ni 80vol %, MgO 20vol % | 1400 | 6 | 5 | 1200 | 1.5 | 19 | 1.4 |
| Example 17 | Ni 33vol %, TaC 33vol %, MgO 34vol % | 1400 | 6 | 5 | 1220 | 1.5 | 18 | 0.6 |
| Example 18 | Co 33vol %, TaC 33vol %, MgO 34vol % | 1450 | 6 | 5 | 1240 | 1.5 | 17 | 0.7 |
| Example 19 | Fe 33vol %, TaC 33vol %, MgO 34vol % | 1500 | 6 | 6 | 1240 | 1.5 | 21 | 0.8 |
| Example 20 | Ni 10vol %, WC 70vol %, MgO 20vol % | 1400 | 6 | 16 | 1280 | 1.5 | 12 | 0.8 |
| Example 21 | Ni 10vol %, TiC 70vol %, MgO 20vol % | 1400 | 6 | 12 | 1320 | 1.5 | 14 | 0.7 |
| Example 22 | Ni 10vol %, TaC 70vol %, MgO 20vol % | 1400 | 6 | 11 | 1340 | 1.0 | 11 | 0.9 |
| Example 23 | Ni 33vol %, NbC 33vol %, MgO 34vol % | 1400 | 6 | 11 | 1340 | 1.5 | 15 | 0.9 |
| Example 24 | $Cr_3C_2$ 50vol %, MgO 50vol % | 1600 | 6 | 6 | 1360 | 1.5 | 32 | 0.6 |
| Example 25 | $Cr_3C_2$ 80vol %, MgO 20vol % | 1600 | 6 | 8 | 1400 | 1.5 | 26 | 0.7 |
| Example 26 | WC 80vol %, MgO 20vol % | 1750 | 2 | 26 | 1340 | 2.0 | 68 | 0.9 |
| Example 27 | WC 70vol %, MgO 30vol % | 1750 | 2 | 20 | 1340 | 2.0 | 39 | 0.9 |
| Example 28 | WC 50vol %, MgO 50vol % | 1750 | 2 | 18 | 1320 | 1.5 | 20 | 0.8 |
| Example 29 | WC 40vol %, MgO 60vol % | 1750 | 2 | 18 | 1320 | 1.5 | 20 | 0.7 |
| Example 30 | WC 34vol %, MgO 66vol % | 1750 | 2 | 12 | 1300 | 1.5 | 28 | 0.7 |
| Example 31 | TiC 80vol %, MgO 20vol % | 1750 | 2 | 20 | 1400 | 1.5 | 22 | 0.6 |
| Example 32 | TiC 70vol %, MgO 30vol % | 1750 | 2 | 18 | 1400 | 1.5 | 24 | 0.6 |
| Example 33 | TiC 50vol %, MgO 50vol % | 1750 | 2 | 16 | 1420 | 1.5 | 30 | 0.5 |
| Example 34 | TiC 40vol %, MgO 60vol % | 1750 | 2 | 12 | 1440 | 1.5 | 30 | 0.5 |
| Example 35 | TiC 34vol %, MgO 66vol % | 1750 | 2 | 9 | 1440 | 1.5 | 36 | 0.9 |
| Example 36 | TaC 80vol %, MgO 20vol % | 1750 | 2 | 22 | 1420 | 1.0 | 10 | 0.6 |
| Example 37 | TaC 70vol %, MgO 30vol % | 1750 | 2 | 18 | 1440 | 1.0 | 18 | 0.6 |
| Example 38 | TaC 50vol %, MgO 50vol % | 1750 | 2 | 16 | 1460 | 1.5 | 16 | 0.6 |
| Example 39 | TaC 40vol %, MgO 60vol % | 1750 | 2 | 12 | 1440 | 1.5 | 22 | 0.6 |
| Example 40 | TaC 34vol %, MgO 66vol % | 1750 | 2 | 10 | 1460 | 1.5 | 21 | 0.7 |
| Example 41 | NbC 80vol %, MgO 20vol % | 1750 | 2 | 20 | 1440 | 1.5 | 24 | 0.6 |
| Example 42 | NbC 70vol %, MgO 30vol % | 1750 | 2 | 16 | 1440 | 1.5 | 24 | 0.6 |

TABLE 2-continued

|  | Electrode material | Firing temperature (° C.) | Firing time (h) | Displacement of flatness (μm) | Attractive force (Pa) | Detachment response time (sec) | Heater resistance (Ω) | Uniformity of temperature distribution (° C.) |
|---|---|---|---|---|---|---|---|---|
| Example 43 | NbC 50vol %, MgO 50vol % | 1750 | 2 | 15 | 1420 | 1.5 | 30 | 0.7 |
| Example 44 | NbC 40vol %, MgO 60vol % | 1750 | 2 | 12 | 1440 | 1.5 | 35 | 0.7 |
| Example 45 | NbC 34vol %, MgO 66vol % | 1750 | 2 | 10 | 1440 | 1.5 | 37 | 0.8 |

Comparative Examples 1 to 14

Electrostatic chucks were produced as in Examples 1 to 45, except that the electrode materials and the firing conditions were changed as shown in Table 3. Among these comparative examples, for each of Comparative Examples 1 to 3, 5, 6, 8, 9, 11, 12, and 14, when the sintered body was ground, the wafer-supporting surface was cracked; hence, subsequent evaluations were not performed. Note that Comparative Examples 1, 2, 5, 8, 11, and 14 are described in the specification of the previous application (Japanese Patent Application No. 2009-215997).

Evaluation
Displacement of Flatness

Grinding a sintered body causes warpage probably attributed to residual stress due to firing and attributed to the difference in thermal expansion coefficient between the electrode material and MgO. That is, a sintered body having a thickness of about 8 mm after firing is subjected to rough processing to form a flat surface. The flatness of the surface is measured and recorded with a three coordinate measuring machine. After the formation of the flat surface by rough processing, the thickness is 7 mm. The flat surface is bonded to a circular surface plate (with a flatness of 1 μm or less) for grinding using wax. Grinding is performed with a diamond grindstone to reduce the thickness. After the thickness reaches a predetermined value (e.g., 4 mm), the sintered body is removed from the circular surface plate by melting the wax. The flatness is measured again. A displacement from the initial flatness (displacement of flatness) is calculated. Tables 2 and 3 show the results. The term "flatness" used here indicates a difference between the maximum value and the minimum value among values measured at 49 measuring points on the surface (which is flat when visually inspected but is not completely flat) having a diameter of 299 mm. For information, in each of the examples, the electrode material has a smaller thermal expansion coefficient than MgO; hence, the chuck was deformed in such a manner that the surface configured to attract a wafer was convex. The deformation can be sufficiently eliminated by finish processing after grinding, so that a surface of a final product can have a flatness of 1 um or less. Thus, if the displacement of flatness is minimized, cracking and so forth is not easily caused during processing, thereby improving the yield.

Attractive Force

A method for measuring an attractive force was identical to that described in Example 46, provided that the applied voltage was 500 V.

TABLE 3

|  | Electrode material | Firing temperature (° C.) | Firing time (h) | Displacement of flatness (μm) | Attractive force (Pa) | Detachment response time (sec) | Heater resistance (Ω) | Uniformity of temperature distribution (° C.) |
|---|---|---|---|---|---|---|---|---|
| Comparative Example 1 | Mo | 1750 | 2 |  |  | Crack |  |  |
| Comparative Example 2 | TiC | 1750 | 2 |  |  | Crack |  |  |
| Comparative Example 3 | TiC 85vol %, MgO 15vol % | 1750 | 2 |  |  | Crack |  |  |
| Comparative Example 4 | TiC 30vol %, MgO 70vol % | 1750 | 2 | 10 | <200 | — | 236 | >10 |
| Comparative Example 5 | TaC | 1750 | 2 |  |  | Crack |  |  |
| Comparative Example 6 | TaC 85vol %, MgO 15vol % | 1750 | 2 |  |  | Crack |  |  |
| Comparative Example 7 | TaC 30vol %, MgO 70vol % | 1750 | 2 | 10 | <200 | — | 280 | >10 |
| Comparative Example 8 | NbC | 1750 | 2 |  |  | Crack |  |  |
| Comparative Example 9 | NbC 85vol %, MgO 15vol % | 1750 | 2 |  |  | Crack |  |  |
| Comparative Example 10 | NbC 30vol %, MgO 70vol % | 1750 | 2 | 10 | <200 | — | 162 | >10 |
| Comparative Example 11 | WC | 1750 | 2 |  |  | Crack |  |  |
| Comparative Example 12 | WC 85vol %, MgO 15vol % | 1750 | 2 |  |  | Crack |  |  |
| Comparative Example 13 | WC 30vol %, MgO 70vol % | 1750 | 2 | 12 | <200 | — | 302 | >10 |
| Comparative Example 14 | W | 1750 | 2 |  |  | Crack |  |  |

Detachment Response Time

A method for measuring a detachment response time was identical to that described in Example 46, provided that the applied voltage was 500 V.

Heater Resistance

The resistance between the two feeding terminals connected to the heater electrode was measured with a tester at 25° C.

Uniformity of Temperature Distribution

A chuck was placed in a vacuum chamber used in measuring the uniformity of temperature distribution in Example 46 described below in the same way as in Example 46. Electric power was fed from a heater power supply (maximum voltage: 208 V, maximum current: 50 A, a thyristor-controlled AC power supply), which was located outside the vacuum chamber, to the feeding terminals connected to the heater electrode. An infrared radiation thermometer (IR camera) was arranged on the upper outer side of the vacuum chamber to observe the surface of the electrostatic chuck through a window arranged at an upper portion of the vacuum chamber. Electric power was fed to the feeding terminals connected to the heater electrode in such a manner that the temperature at the center of the surface of the electrostatic chuck was 100° C. while cooling water having a temperature of 60° C. was flowing to a cooling panel, thereby stabilizing the temperature of the chuck. In this situation, the temperature distribution of a Si wafer attracted to the surface of the electrostatic chuck was measured with the IR camera.

Tables 2 and 3 show the evaluation results of Examples and Comparative Examples. In each of the electrostatic chucks of Examples 1 to 3, the electrostatic electrode and the heater electrode embedded in the ceramic having a MgO content of 99% or more were composed of at least one metal selected from Ni, Co, and Fe. Each of the electrostatic chucks of Examples 1 to 3 had a small displacement of flatness, a high attractive force, a satisfactory detachment response, and a satisfactorily uniform temperature distribution. The reason for this may be as follows: The metal powder of Ni, Co, or Fe does not react with MgO and does not diffuse. Thus, when the metal powder is sintered together with MgO, an electrode layer composed of the sintered metal powder is formed. Hence, the electrode layer had satisfactory conductivity. Furthermore, the electrode layer had a thermal expansion coefficient close to that of MgO, so that cracking did not occur. In contrast, in each of the electrostatic chucks of Comparative Examples 1 and 14, the use of W or Mo for the electrostatic electrode and the heater electrode caused cracking during grinding. The reason for this may be that since W and Mo had a thermal expansion coefficient significantly different from that of MgO, residual stress occurring during firing was released during grinding to cause cracking.

In each of the electrostatic chucks of Examples 4 to 15, the electrostatic electrode and the heater electrode embedded in the ceramic having a MgO content of 99% or more were composed of a conductive material produced by sintering a mixture of at least one metal powder selected from Ni, Co, and Fe powders and at least one carbide powder selected from TiC, TaC, and NbC powders. Each of the electrostatic chucks of Examples 4 to 15 had a small displacement of flatness, a high attractive force, a satisfactory detachment response, and a satisfactorily uniform temperature distribution. Furthermore, each of the chucks had a more satisfactory uniformity of the temperature distribution than those of the electrostatic chucks of Examples 1 to 3. The reason for this may be as follows: TiC, TaC, and NbC had resistance to sintering and high hardness. They were dispersed in the relatively soft metal of Ni, Co, or Fe and served as three-dimensional skeletons, thereby preventing deformation of the electrode layer in the planar direction during the hot-pressing step. If the deformation of the electrode layer in the planar direction is not prevented, the pattern of the heater electrode extends in the planar direction, causing variations in heat density. In each of Examples 4 to 15, the deformation of the electrode layer in the planar direction was prevented, so that the variations in heat density were prevented. Here, the mixing ratio, in percent by volume, of the metal powder to the carbide powder is preferably 82 to 34:18 to 66 (the sum of both is 100%). A carbide powder content of less than 18% by volume can lead to insufficient prevention of the deformation of the metal in the planar direction. A carbide powder content exceeding 66% by volume can lead to a reduction in strength due to insufficient sintering of the carbide having resistance to sintering.

In the electrostatic chuck of Example 16, the electrostatic electrode and the heater electrode embedded in the ceramic having a MgO content of 99% or more were composed of a conductive material produced by sintering a mixture of a MgO powder and at least one metal powder selected from Ni, Co, and Fe powders. The electrostatic chuck of Example 16 had a small displacement of flatness, a high attractive force, a satisfactory detachment response, and a satisfactorily uniform temperature distribution. The chuck had a more satisfactory uniformity of the temperature distribution than that of the electrostatic chuck of Examples 1. The reason for this may be as follows: The incorporation of the MgO powder into the metal powder such as a Ni powder allowed the thermal expansion coefficient of the electrode layer to be close to that of MgO and prevented the deformation of the relatively soft metal in the planar direction by the fact that MgO served as a skeleton. Here, the mixing ratio, in percent by volume, of the metal powder to MgO is preferably 34 to 82:66 to 18 (the sum of both is 100%). A MgO content of less than 18% by volume can lead to the deformation of the metal in the planar direction. That is, the effect of the incorporation of MgO is unlikely to be provided. A MgO content exceeding 66% by volume can cause disconnection of the metal grains, thereby sharply increasing the resistance of the electrode layer, which is not easily controlled.

In each of the electrostatic chucks of Examples 17 to 23, the electrostatic electrode and the heater electrode embedded in the ceramic having a MgO content of 99% or more were composed of a conductive material produced by sintering a mixture of a MgO powder, at least one metal powder selected from Ni, Co, and Fe powders, and at least one carbide powder selected from TiC, TaC, and NbC powders. Each of the electrostatic chucks had a relatively small displacement of flatness, a high attractive force, a satisfactory detachment response, and a satisfactorily uniform temperature distribution. Each of the chucks had a more satisfactory uniformity of the temperature distribution than those of the electrostatic chucks of Examples 1 to 3. The reason for this may be the same as that in Examples 4 to 15 and 16. Here, mix proportions, in percent by volume, of the metal powder, the carbide powder, and the MgO powder in the mixture are preferably 10 to 33:33 to 70:20 to 34 (the sum of the three components is 100%). If the mix proportions are outside the numerical range, the electrode layer can extend and can have an excessively high resistance and an excessively large displacement of flatness.

In each of the electrostatic chucks of Examples 24 and 25, the electrostatic electrode and the heater electrode embedded in the ceramic having a MgO content of 99%, or more were composed of a conductive material produced by sintering a mixture of a MgO powder and a $Cr_3C_2$ powder. Each of the electrostatic chucks had a small displacement of flatness, a high attractive force, a satisfactory detachment response, and a satisfactorily uniform temperature distribution. Here, the mixing ratio, in percent by volume, of the $Cr_3C_2$ powder to the MgO powder is preferably 50 to 80:20 to 50 (the sum of both is 100%). At a MgO content of less than 20% by volume, the electrode layer may not have a thermal expansion coefficient sufficiently close to that of MgO, thus failing to sufficiently preventing deformation of the metal in the planar direction. A MgO powder content exceeding 50% by volume can cause disconnection of the network of conductive $Cr_3C_2$, thereby leading to an excessive increase in heater resistance and a reduction in heating value even if the same voltage is applied.

In each of the electrostatic chucks of Examples 26 to 45, the electrostatic electrode and the heater electrode embedded in the ceramic having a MgO content of 99% or more were composed of a conductive material produced by sintering a mixture of a MgO powder and at least one carbide powder selected from the group consisting of WC, TiC, TaC, and NbC powders. Each of the electrostatic chucks had a relatively small displacement of flatness, a high attractive force, a satisfactory detachment response, and a satisfactorily uniform temperature distribution. The use of the metal carbides for these electrostatic chucks results in a higher firing temperature and a shorter firing time, thereby increasing the attractive force. The reason for this may be that MgO forms a three-dimensional network in the electrode layer and is sintered integrally with the MgO sintered body located outside the electrode layer to increase the dielectric constant of the dielectric layer, thus increasing the attractive force. In each of Examples 29 to 45, TiC, TaC, or NbC, which has a thermal expansion coefficient closer to that of MgO, is used as the metal carbide, which is more preferred. Here, the mixing ratio, in percent by volume, of the metal carbide to the MgO powder is preferably 34 to 80:20 to 66 (the sum of both is 100%). At a MgO content of less than 20% by volume, the electrode layer may not have a thermal expansion coefficient sufficiently close to that of MgO, thus failing to sufficiently preventing deformation of the metal in the planar direction. A MgO powder content exceeding 66% by volume can cause disconnection of the network of the conductive metal carbide, thereby leading to an excessive increase in heater resistance and a reduction in heating value even if the same voltage is applied. In each of the electrostatic chucks of Comparative Examples 2, 5, 8, and 11, the electrostatic electrode and the heater electrode were composed of a metal carbide that had a MgO content of 0% by volume. Each of the electrostatic chucks was cracked because of the difference in thermal expansion coefficient between the metal carbide and MgO, which is not preferred.

For each of the electrostatic chucks of Examples 1 to 45, a voltage of 500 V was applied to the electrostatic electrode, and the temperature of the electrostatic chuck was adjusted to 90° C. In this situation, the leakage current between the electrostatic electrode and the heater electrode was measured and found to be less than 0.1 µA, which was very small value compared with a leakage current of 50 to 100 µA of electrostatic chucks of the Johnsen-Rahbek type in the related art. Furthermore, in each of the electrostatic chucks of Examples 1 to 45, the use of the same materials for the base as in Example 46 described later is unlikely to cause the metal contamination of the wafer.

Example 46

A specific example of the electrostatic chuck 10 according to the second embodiment is described in Example 46. First, 0.5 parts by weight of poly(vinyl alcohol) and 100 parts by weight of water were mixed with 50 parts by weight of a MgO powder (with an average particle size of 1.2 µm) having a purity of 99.5% (containing trace amounts of Al, Si, Ca, P, and N and several parts per million or less other metal elements, as impurities) to form a slurry. The slurry was subjected to spray drying to form a granulated MgO powder (with an average particle size of 30 to 40 µm). The granulated MgO powder was charged into a die and was then leveled off. Uniaxial pressing was performed at a pressure of 10 MPa to form a disc-like compact having a diameter of 320 mm and a thickness of 7 mm. The compact was transferred into a graphite die. The graphite die was placed in a hot-press furnace and fired at 1800° C. for 2 hours at a pressure of 1.01 atm in nitrogen and a uniaxial pressure of 20 MPa, forming a MgO sintered body. The MgO sintered body was ground with diamond to form a disc having a thickness of 3 mm and a diameter of 330 mm. The disc had a surface roughness Pa of 2 µm and a sintered density of 99.5% or more. A main surface with a diameter of 330 mm had a flatness of 10 µm or less.

A Ni powder having a purity of 99.9% (a particle size of 3 µm) was mixed with terpineol to form an electrode paste. The electrode paste was applied to a surface of the disc-shaped MgO sintered body by screen printing to form an electrostatic electrode. The electrostatic electrode was circular and had an external diameter of 297 mm and holes in necessary portions. The holes were located at the portions through which a lift pin will be inserted and a through-hole configured to feed a gas will be formed. After printing, drying was performed at 60° C. in air to fix the electrostatic electrode. A Ni disc (hereinafter, referred to as a "Ni tablet") having a diameter of 2 mm and a thickness of 1 mm was bonded at the center of the electrostatic electrode using an adhesive (for example, starch paste or an organic adhesive, such as a paper bond, is preferred because it is decomposed and eliminated).

The MgO sintered body on which the electrostatic electrode had been fixed was placed in a die with the electrostatic electrode surface up. A granulated MgO powder was charged into the die so as to be deposited on the electrostatic electrode. Uniaxial pressing was performed at 10 MPa. A molded portion had a thickness of 7 mm. The resulting laminate including the sintered body and the molded portion was placed in a graphite die. The graphite die was placed in a hot-press furnace and fired at 1400° C. for 6 hours at a pressure of 1.01 atm in nitrogen and a uniaxial pressure of 24 MPa, thereby forming a MgO sintered body in which the electrostatic electrode was embedded. The MgO sintered body was ground to have a disc shape having a diameter of 299 mm and a thickness of 4 mm. In this case, the distance between a surface of the embedded electrostatic electrode and a surface (wafer-supporting surface) configured to attract and hold a wafer was 0.4 mm.

Next, a counter-bored hole having a diameter of 5 mm was formed at the center of a surface opposite the attracting surface to expose the Ni tablet at the bottom of the counter-bored hole. In addition, through-holes were formed in predetermined portions to form a gas feed hole and a hole through which a lift pin configured to lift a wafer will be inserted. Then a feeding terminal, composed of Ni, having a diameter of 4.9 mm and a length of 7 mm was inserted and bonded to the exposed surface of the Ni tablet and the inner circumference, which was composed of the MgO ceramic, of the counter-bored hole using a gold brazing alloy. Gold brazing was performed at 1010° C. for 5 minutes in a vacuum furnace at an atmospheric pressure of 100 Pa or less. As described above, an electrostatic chuck of Example 46 was produced. This electrostatic chuck was a chuck in which the electrostatic electrode was embedded in the ceramic base having the wafer-supporting surface. The ceramic base was composed of a ceramic sintered body having a MgO content of 99% by weight or more. The electrostatic electrode was composed of Ni.

Comparative Example 15

A MgO powder (with an average particle size of 1.2 µm) having a purity of 99.5, was mixed with a TiC powder and a $Co_3O_4$ powder to prepare a mixed raw material powder containing 0.6% by volume TIC and 1.7% by volume $Co_3O_4$. Then 0.5 parts by weight of polyvinyl alcohol) and 100 parts by weight of water were mixed with 50 parts by weight of the mixed raw material powder to form a slurry. The slurry was subjected to spray drying to form a granulated powder with an average particle size of 30 to 40 µm).

The granulated powder was charged into a die and was then leveled off. Uniaxial pressing was performed at a pressure of 10 MPa to form a disc-like compact having a diameter of 320 mm and a thickness of 7 mm. An electrostatic electrode formed of a Mo mesh having a diameter of 297 mm was placed thereon. Furthermore, a Mo disc (hereinafter, referred to as a "Mo tablet") having a diameter of 2 mm and a thickness of 1 mm was bonded at the center of the electrostatic electrode using an adhesive. The granulated powder of the raw material mixture was charged into the die so as to be deposited on the electrostatic electrode. Uniaxial pressing was performed at 10 MPa. A molded portion had a thickness of 7 mm. In this way, an intermediate was produced in which the electrostatic electrode was embedded in the molded article formed of the granulated powder of the raw material mixture. This intermediate was placed in a graphite die. The graphite die was placed in a hot-press furnace and fired at 1400° C. for 6 hours at a pressure of 1.01 atm in nitrogen and a uniaxial pressure of 24 MPa, thereby forming a MgO sintered body in which the electrostatic electrode was embedded.

Next, the MgO sintered body was ground to have a disc shape having a diameter of 299 mm and a thickness of 4 mm. However, at this stage, when the thickness between the electrostatic electrode formed of the Mo mesh and a surface (wafer-supporting surface) reached 1 mm, microcracking occurred in the MgO sintered body located in the vicinity of the outer periphery of the surface.

Next, a counter-bored hole having a diameter of 5 mm was formed at the center of a surface opposite the attracting surface to expose the Mo tablet at the bottom of the counter-bored hole. In addition, through-holes were formed in predetermined portions to form a gas feed hole and a hole through which a lift pin configured to lift a wafer will be inserted. Then a feeding terminal, composed of Mo, having a diameter of 4.9 mm and a length of 7 mm was inserted and bonded to the exposed surface of the Mo tablet and the inner circumference, which was composed of the MgO ceramic, of the counter-bored hole using a gold brazing alloy. Gold brazing was performed at 1010° C. for 5 minutes in a vacuum furnace at an atmospheric pressure of 100 Pa or less. As described above, an electrostatic chuck of Comparative Example 15 was produced.

Evaluation

Attractive Force and Detachment Response

Each of the electrostatic chucks of Example 46 and Comparative Example 15 was bonded to a cooling panel, composed of Al, using a bonding sheet composed of silicone and then placed in a vacuum chamber. A lifting and lowering device including an electrical connector configured to apply a voltage to the electrostatic electrode of the electrostatic chuck, a gas hole that will communicate with the gas feed hole, and a lift pin configured to lift a wafer was attached to the cooling panel composed of Al. The cooling panel included a cooling channel configured to allow a cooling medium to pass therethrough in order to control the temperature. Next, the Al cooling panel was maintained at 60° C. under vacuum at 100 Pa. A Si wafer was placed on the wafer-supporting surface of the electrostatic chuck. A predetermined voltage was applied to the electrostatic electrode to attract and hold the Si wafer. Then Ar gas was fed to the back side of the Si wafer through the gas feed hole of the electrostatic chuck. The gas pressure was gradually increased from 100 Pa with the flow rate of the gas monitored. The gas pressure when the gas flow rate was sharply increased was measured. The gas pressure when the gas flow rate was rapidly increased was defined as the attractive force of the electrostatic chuck. Here, an annular projection was located at the circumference of the wafer-supporting surface of the electrostatic chuck to form an enclosed region between the attracted Si wafer and the wafer-supporting surface. Thus, the gas pressure in the enclosed region was equal to the gas pressure of the gas fed. Next, the pressure of the gas fed was set to 500 Pa while a voltage was applied to the electrostatic electrode to attract the wafer to the wafer-supporting surface. The time from when the applied voltage was set to 0 V to when the flow rate of the gas fed was sharply increased was measured. That is, the sharp increase in gas flow rate indicates the detachment of the wafer from the electrostatic chuck. This time is defined as the detachment response time. A detachment response time closer to zero second results in better throughput because the wafer is rapidly detached from the electrostatic chuck.

Metal Contamination of Back Surface of Wafer

A Si wafer was used in which concentrations of contaminating metals on the front and back surfaces were $0.1 \times 10^{10}$ atoms/cm$^2$ or less (except for Si). An electrostatic chuck attached in a vacuum chamber installed in a class 100 clean room was maintained at 60° C. The Si wafer was attached at an attractive force of 1 kPa. After a lapse of 2 minutes, the attractive force was set to 0 to remove the Si wafer. Concentrations of contaminating metals on the back surface of the Si wafer, i.e., on the surface that had been contacted to the electrostatic chuck, was measured by inductively coupled plasma-mass spectrometry (ICP-MS) using solution extraction. Specifically, 1 cc of a 1 mol % hydrofluoric acid solution was dropped on a measuring surface. After a lapse of 1 minute, the hydrofluoric acid solution was sucked with a dropper. The hydrofluoric acid solution was analyzed with an ICP-MS system to determine concentrations of metal elements in the solution. The amount of each metal element attached per unit area was calculated on the basis of the concentrations of the metal elements, the amount of the solution, and the area of the wafer occupied by the dropped hydrofluoric acid solution. Note that the operation from the attraction of the wafer to the extraction using the hydrofluoric acid solution was performed in the class 100 clean room to eliminate contamination from the system. The results demonstrated that the yield of the device is reduced when the concentration of each of the contaminating metals exceeds $10 \times 10^{10}$ atoms/cm$^2$.

Table 4 shows the evaluation results of Example 46 and Comparative Example 15.

TABLE 4

| | Base material | Electrode material | Applied voltage (V) | Attractive force (Pa) | Detachment response time (sec) | Analysis result ($\times 10^{10}$ atoms/cm$^2$) | | |
|---|---|---|---|---|---|---|---|---|
| | | | | | | Fe | Co | Ti |
| Example 46 | MgO | Ni | 500 | 1200 | 1.5 | 5 | 3 | 2 |
| | | | 800 | 1900 | 1.5 | | | |
| | | | 1000 | 2300 | 1.5 | | | |
| Comparative Example 15 | MgO + TiC + Co$_3$O$_4$ | Mo | 400 | 1600 | 6 | 7 | 450 | 380 |
| | | | 500 | 2000 | 8 | | | |
| | | | 800 | Arcing | | | | |

As is clear from Table 4, the electrostatic chuck of Example 46 had a sufficient attractive force and a short detachment response time. That is, the detachment response to the applied voltage was very good. The dielectric layer (in the ceramic base, a region between the wafer-supporting surface and the electrostatic electrode (i.e., a 0.4-mm-thick portion of the MgO sintered body)) of the electrostatic chuck had a volume resistivity of $3 \times 10^{15}$ Ω·cm, which is a sufficient insulation resistance as a Coulomb type. In contrast, in the electrostatic chuck of Comparative Example 15, although the attractive force at the same voltage was higher than that in Example 46, the detachment response time was long, reducing the throughput. Furthermore, an undetached wafer can be lifted and broken, depending on sequencing strategy. Moreover, in Comparative Example 15, when a voltage of 800 V was applied, arcing occurred, thereby electrically connecting the microcracked surface to the electrostatic electrode. As a result, the electrostatic chuck was not able to be used.

In the electrostatic chuck of Example 46, the concentration of each of the contaminating metals on the back surface of the Si wafer was $10 \times 10^{10}$ atoms/cm$^2$ or less. In the electrostatic chuck of Comparative Example 15, Co and Ti contained in the ceramic were transferred onto the back surface of the Si wafer to contaminate the wafer with Co and Ti. In the electrostatic chuck of Comparative Example 15, which caused arcing, Mo was detected on the wafer-supporting surface (not shown in Table 4). The wafer-supporting surface was contaminated with the Mo element by arcing. In the electrostatic chuck of Comparative Example 15 before causing arcing, Mo is negligibly detected. The results demonstrate that arcing damaged the dielectric layer, so that Mo in the electrostatic electrode migrated to the wafer-supporting surface.

The present application claims priority from Japanese Patent Application No. 2009-215997 filed on Sep. 17, 2009, the entire contents of which are incorporated herein by reference.

What is claimed is:

1. An electrostatic chuck comprising an electrostatic electrode embedded in a MgO ceramic base having a wafer-supporting surface that is parallel to the electrostatic electrode,
   wherein the electrostatic electrode is composed of any one conductive material selected from the group consisting of the following (1) to (6):
   (1) a conductive material produced by firing at least one metal selected from the group consisting of Ni, Co, and Fe,
   (2) a conductive material produced by firing a mixture of at least one metal powder selected from the group consisting of Ni, Co, and Fe powders and at least one carbide powder selected from the group consisting of TiC, TaC, and NbC powders,
   (3) a conductive material produced by firing a mixture of a MgO powder and at least one metal powder selected from the group consisting of Ni, Co, and Fe powders,
   (4) a conductive material produced by firing a mixture of a MgO powder, at least one metal powder selected from the group consisting of Ni, Co, and Fe powders, and at least one carbide powder selected from the group consisting of TiC, TaC, and NbC powders,
   (5) a conductive material produced by firing a mixture of a MgO powder and a $Cr_3C_2$ powder, or
   (6) a conductive material produced by firing a mixture of a MgO powder and at least one carbide powder selected from the group consisting of WC, TiC, TaC, and NbC powders.

2. The electrostatic chuck according to claim 1, further comprising a heater electrode that is embedded to be parallel to the wafer-supporting surface and composed of any one of the items (1) to (6).

3. The electrostatic chuck according to claim 2, wherein the heater electrode is composed of the same material as that of the electrostatic electrode.

4. The electrostatic chuck according to claim 1, wherein the MgO ceramic base does not contain a heavy-metal element.

5. A method for producing an electrostatic chuck including an electrostatic electrode embedded in a MgO ceramic base having a wafer-supporting surface that is parallel to the electrostatic electrode, the method comprising the steps of:
   forming a disc-like thin film composed of an electrode paste for the electrostatic electrode on a surface of a MgO ceramic sintered body; stacking a MgO powder compact on the thin film, thereby forming a laminate; and sintering the laminate by hot pressing,
   wherein the electrode paste contains any one material selected from the group consisting of the following (a) to (f):
   (a) at least one metal selected from the group consisting of Ni, Co, and Fe,
   (b) a mixture of at least one metal powder selected from the group consisting of Ni, Co, and Fe powders and at least one carbide powder selected from the group consisting of TiC, TaC, and NbC powders,
   (c) a mixture of a MgO powder and at least one metal powder selected from the group consisting of Ni, Co, and Fe powders,
   (d) a mixture of a MgO powder, at least one metal powder selected from the group consisting of Ni, Co, and Fe powders, and at least one carbide powder selected from the group consisting of TiC, TaC, and NbC powders,
   (e) a mixture of a MgO powder and a $Cr_3C_2$ powder, or
   (f) a mixture of a MgO powder and at least one carbide powder selected from the group consisting of WC, TiC, TaC, and NbC powders.

6. A method for producing an electrostatic chuck including an electrostatic electrode and a heater electrode that are embedded in a MgO ceramic base having a wafer-supporting surface that is parallel to the electrostatic electrode and the heater electrode, the method comprising the steps of:
   forming a disc-like thin film composed of an electrode paste for the electrostatic electrode on a surface of a MgO ceramic sintered body; stacking a MgO powder compact on the thin film to form a first intermediate; separately forming a heater electrode pattern composed of an electrode paste for the heater electrode on a surface of a MgO ceramic sintered body to form a second intermediate; stacking the second intermediate on the MgO powder compact of the first intermediate in such a manner that the heater electrode pattern contacts the MgO powder compact, thereby forming a laminate; and sintering the laminate by hot pressing,
   wherein each of the electrode pastes independently contains any one material selected from the group consisting of the following (a) to (f):
   (a) at least one metal selected from the group consisting of Ni, Co, and Fe,
   (b) a mixture of at least one metal powder selected from the group consisting of Ni, Co, and Fe powders and at least one carbide powder selected from the group consisting of TiC, TaC, and NbC powders,
   (c) a mixture of a MgO powder and at least one metal powder selected from the group consisting of Ni, Co, and Fe powders, (d) a mixture of a MgO powder, at least one metal powder selected from the group consisting of Ni, Co, and Fe powders, and at least one carbide powder selected from the group consisting of TiC, TaC, and NbC powders,
(e) a mixture of a MgO powder and a $Cr_3C_2$ powder, or
(f) a mixture of a MgO powder and at least one carbide powder selected from the group consisting of WC, TiC, TaC, and NbC powders.

7. The method according to claim 5, wherein the MgO ceramic base does not contain a heavy-metal element.

8. The method according to claim 6, wherein the MgO ceramic base does not contain a heavy-metal element.

* * * * *